United States Patent [19]

Smirl

[11] 4,270,218
[45] May 26, 1981

[54] CONTINUOUS TUNE ALL-CHANNEL SELECTOR

[75] Inventor: Richard A. Smirl, Chicago, Ill.

[73] Assignee: Zenith Radio Corporation, Glenview, Ill.

[21] Appl. No.: 119,348

[22] Filed: Feb. 7, 1980

[51] Int. Cl.³ .............................................. H04B 1/16
[52] U.S. Cl. .................................. 455/176; 455/180; 334/15
[58] Field of Search ............... 455/160, 170, 173, 176, 455/178, 179, 180, 182, 188; 358/191.1, 193.1; 334/15, 86, 17, 87, 18; 74/10 R, 10.52

[56] References Cited

U.S. PATENT DOCUMENTS

| Re. 29,786 | 9/1978 | Weigel | 334/86 |
|---|---|---|---|
| 3,707,877 | 1/1973 | Kondo | 74/10.52 |
| 3,715,495 | 2/1973 | Takezaki | 334/15 |
| 3,906,373 | 9/1975 | Hendrickson | 455/176 |
| 3,942,122 | 3/1976 | Nakanishi | 455/180 |
| 3,962,643 | 6/1976 | Ma | 455/180 |
| 3,965,427 | 6/1976 | Ma | 455/182 |

FOREIGN PATENT DOCUMENTS 1201385 8/1970 United Kingdom ..................... 455/179

Primary Examiner—Jin F. Ng
Assistant Examiner—Tommy P. Chin
Attorney, Agent, or Firm—Thomas E. Hill

[57] ABSTRACT

Disclosed is a UHF-VHF combination channel selector for use with varactor diode tuners in which varactor control voltage is provided by a plurality of tapered potentiometers covering the various tuning segments. Non-detent, continuous channel selection is provided by rotation of a single control shaft to which is coupled a potentiometer wiper assembly. A substantially linear tuner control angular displacement versus channel number displacement over both frequency bands is achieved by compensating for varactor tuner nonlinearity over the VHF-band with complementary VHF selector potentiometers while hyper abrupt junction varactor diode manufacturing tolerances are compensated for by normalization of the UHF selector by means of upper and lower band tapered potentiometers. Selector circuitry including the various potentiometers and associated resistors forming voltage divider networks is in substrate form on one side of the selector board while band select switching is provided on the other side of the selector board.

17 Claims, 12 Drawing Figures

CONTINUOUS TUNE ALL-CHANNEL SELECTOR

BACKGROUND OF THE INVENTION

This invention relates generally to channel selector systems utilized in tuning a television receiver to a desired channel and specifically to channel selectors having a single rotatable shaft by which both UHF and VHF channels can be selected in a comparable manner.

Commercial television stations broadcast in two frequency spectra, the very high frequency (VHF) and the ultra high frequency (UHF) bands. The VHF band includes channels 2 through 13 operating at frequencies of from 57 megahertz (MHz) to 213 MHz while the UHF band includes channels 14 through 83 operating over a frequency range of from 473 MHz to 887 MHz. The VHF broadcast band is generally further broken down into low VHF for channels 2 through 6 operating at frequencies from 57 MHz to 85 MHz and high VHF for channels 7 through 13 operating at frequencies from 177 MHz to 213 MHz. Early dual band tuners for television receivers included separate controls and circuitry for the UHF and VHF frequency bands. These initial tuners tended to be physically large, overly complex and included a large number of components which resulted in low reliablility and high unit cost. The development of the variable capacitance diode, or varactor diode, however, and its incorporation in the variable tuning stages of a television receiver tuner significantly alleviated the aforementioned limitations of the primarily electro-mechanical tuners of the prior art.

In general, a television tuner has several tunable circuits which can be tuned to the frequency of the channel to be received and an oscillator tuner circuit which is offset from the tunable circuit frequency by the frequency of the intermediate frequency amplifier. It is this intermediate frequency signal which is actually used in tuning to the desired channel but the generation of this intermediate frequency signal is extremely important in all aspects of tuner performance. Varactor diodes are used in the generation of the intermediate frequency signal for varying the resonant frequency of the tunable circuit. Tuning is accomplished by varying a DC voltage applied to the varactor generally by means of a variable resistor such as a potentiometer, which results in a variation in capacitance of the varactor. By thus varying the capacitance of the tuning circuit, its resonant frequency may be accurately changed in order to produce the desired intermediate frequency signal when mixed with the output of the variable frequency local oscillator stage.

The replacement of the earlier electromechanical tuners with the electronic tuner made possible by the use of varactor diodes was accompanied by the development of a single rotary-type control, combination UHF-VHF tuner system which replaced the earlier systems having separate UHF and VHF tuner controls. These earlier systems included a separate control knob or dial for the two tuners with a 13-position detent-type tuner for VHF channel selection and for UHF band selection. With the UHF band selected on the VHF tuner, UHF channel selection was available by means of a separate control for the UHF tuner. While VHF tuning was accomplished by a detent-type tuner, UHF tuning was performed by continuously tuning through all frequencies in the UHF spectrum. While a detent arrangement over both frequency bands may be desirable, it is not practical in view of the large number of channels (70) available in the UHF broadcast band. On the other hand, the mechanical action of a detent tuning system results in reduced tuning system reliablilty and operating lifetime. In addition to these shortcomings, the earlier combination UHF-VHF tuners failed to comply with Federal Communications Commission regulations requiring that the tuning arrangement for a domestic television receiver must be so designed as to enable the viewer to select, with equal ease and in a comparable manner, all UHF and VHF channels.

One example of a prior art UHF-VHF combination tuner is disclosed in U.S. Pat. No. 3,707,877 wherein is described an all-channel tuner controlled by a single rotatable selector shaft which is axially movable. Axial movement of the selector shaft permits engagement of appropriate gears in selecting either the UHF or VHF broadcast band. This action also results in the engagement of appropriate gears for channel selection. A DC voltage is provided to varactor diodes in the tuner by means of an infinitely variable resistor resulting in a continuous, nondetent, tuning system for both UHF and VHF bands. However, selection of UHF and VHF channels is not comparable since only one revolution of the control shaft is required to tune from channel 14 to channel 83 while two revolutions of the control shaft are required in tuning from channel 2 to channel 13. Thus, the inter-channel separation between UHF channels is one-half the frequency range of VHF inter-channel separation. This results in increased difficulty and reduced accuracy in UHF tuning. In addition, the utilization of a single variable resistor requires the use of a selectively engageable gear system which significantly increases the complexity of this all-channel tuning system while reducing its reliability because of the high number of moving parts. Another multiband tuner control system is disclosed in U.S. Pat. No. 3,942,122 wherein is described a channel selection circuit including a pair of switch bands, one of which is used to select the tens digit of a television station number and the other of which is used to select the units digit. Thus, the bank of the units switch is used to select one of ten UHF potentiometers in a group used to tune to each of the ten channels which are possible within each UHF decade. This large number of adjustable potentiometers, in one embodiment of the invention described therein 60 potentiometers are shown, necessarily results in channel tuning inaccuracies primarily due to contact resistance variations within the potentiometers. Such tuning inaccuracies are particularly critical in the UHF band where inter-channel frequency spacing is much smaller than in the VHF band. The complexity of this system outweighs any advantages available from the single control feature or the equivalent tuning procedure for both UHF and VHF channels. Still another all-channel UHF-VHF television tuner is disclosed in U.S. Pat. No. Re. 29,786. This invention, however, utilizes a single detented selector shaft for individually selecting channels in both UHF and VHF bands. It thus lacks the inherent reliability of a continuous-type, nondetent tuning system with its absence of mechanical stresses and high impulse contact forces between components.

In order to accommodate the wide frequency spectrum covering the UHF and VHF television broadcast bands so-called hyper abrupt junction varactor diodes were initially incorporated in all-channel type tuners. These hyper abrupt varactor diodes differ from abrupt varactor diodes in that they exhibit larger capacitance changes for a given tuning voltage change. This permits greater frequency coverage for a particular voltage variation in the tunable stages. This enhanced performance is achieved by increasing the dopant gradient at the junction of the varactor diode. This increased frequency tuning capability in hyper abrupt varactor diodes is not without its shortcomings, however. For example, hyper abrupt varactor are not only more expensive than abrupt varactors but also exhibit a significantly greater variation in performance characteristics. These performance variations become particularly critical in the typical tuner system in which several varactors must be carefully selected to insure matched performance among the various tuning stages in both the UHF and VHF bands. This careful matching procedure further increases the manufacturing costs of hyper abrupt varactor diode tuning systems. These disadvantages tend to outweigh the advantages of increased frequency band coverage and enhanced channel selection separation over both UHF and VHF bands provided by hyper abrupt varactor tuners.

U.S. Pat. No. 3,962,643 discloses an abrupt junction varactor diode television tuner in which a plurality of equally spaced, circumferentially arranged metalized areas form stationary contacts each of which permits tuning to a particular channel. Because of the large number of UHF channels and the fact that each is represented by an individual metal contact position on the circumference of a circle, this tuner system affords tuning to only six UHF channels in combination with the twelve VHF channels. End terminals of each divider network in the individual tuning stages are coupled to adjustable potentiometers for setting the tuning voltage at each extreme of the voltage divider. In this manner correct tuning voltages for signals between these end points are automatically obtained because of the precise ratio between resistors in the voltage divider network and the predictable capacitance-voltage characteristics of abrupt junction varactor diodes. This approach thus fails to offer a continuous-type tuning capability and permits tuning to only a very limited number of UHF channels with the common UHF-VHF rotatable control shaft. See also U.S. Pat. No. 3,965,427.

The present invention, however, overcomes the aforementioned limitations by providing an all-channel selector for controlling a UHF-VHF television tuner in which a substantially linear relationship exists between single control shaft angular rotation and channel number displacement over both tuning bands with continuous, non-detent channel selection available. The instant invention not only fully satisfies FCC regulation regarding equivalence in tuning to UHF and VHF channels, but also operates with abrupt junction varactor diodes while achieving bandwidth tuning and channel number angular separation heretofore available only with hyper abrupt varactor diode tuning systems.

OBJECTS OF THE INVENTION

Accordingly, it is an object of the present invention to provide a novel channel selector for tuning a television receiver to both UHF and VHF channels in a comparable manner.

Another object of the present invention is to provide a channel selector which is controlled by means of a single rotatable shaft for receiving both UHF and VHF signals.

Still another object of the present invention is to provide a rotatable, single control shaft channel selector in which a substantially linear relationship exists between control shaft angular displacement and channel number displacement over both UHF and VHF broadcast bands.

A further object of the present invention is to provide a channel selector capable of operating with varactor tuners possessing a large range of UHF performance characteristics by means of a simple adjustment made to selector circuitry when the selector and tuner are initially integrated.

Still another object of the present invention is to provide a continuous, all-channel selector for a television receiver in which channel detent positions are eliminated by means of a novel substrate bandswitching and varactor drive assembly.

Still another object of the present invention is to provide a continuous, all-channel selector for operation with a varactor tuner capable of more accurately tuning to a selected channel.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF PREFERRED EMBODIMENT

Figure 1:
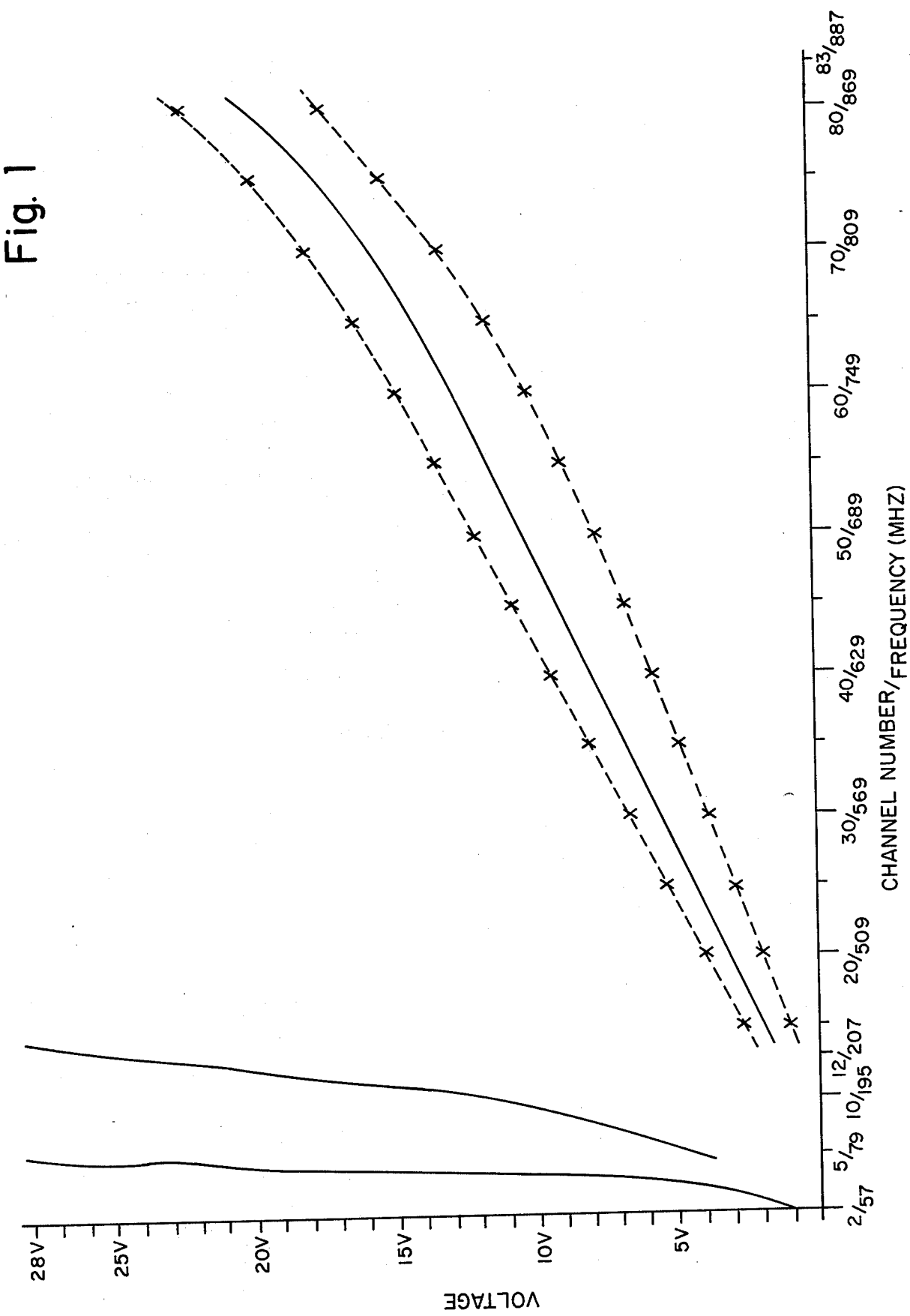
FIG. 1 illustrates the relationship of input tuning voltage to tuning frequency of a typical television receiver tuning stage utilizing abrupt junction varactor diodes over the VHF spectrum and hyper abrupt junction varactor diodes over the UHF spectrum.

Referring to FIG. 1, there is shown the relationship between tuning voltage applied to a typical television receiver tuning stage and the operating frequency, or corresponding channel number, of that tuning stage. With the VHF band extending from approximately 57 MHz to 213 MHz, the two curves on the left of FIG. 1, curves 1 and 2, represent typical tuning curves for an abrupt junction varactor diode tuning stage. With the UHF band extending from channel 14 through channel 84, the curve on the left of the FIG. 1, curve 3, represents the operating characteristics of a hyper abrupt junction varactor diode tuning stage. As can be seen from curves 1 and 2, the nonlinearity of the voltage-frequency relationship of the abrupt junction varactor diode tuner is taken advantage of in the VHF spectrum where large voltage variation is required over a relatively few channel numbers. With each television channel occupying a six MHz bandwidth, the abrupt junction varactor diode tuner provides sufficient tuning voltage spread for adequate separation of VHF channels. Curve 1 illustrates abrupt junction varactor diode tuning characteristics over channels 2–6 while curve 2 shows abrupt junction varactor tuning characteristics over channels 7–13. Although the VHF bandwidth is small, the steep voltage gradient between adjacent VHF channels imposes rigid operating requirements on a VHF tuner. Abrupt junction varactors generally satisfy these operating criteria since they exhibit small performance variations from diode to diode in a given production lot and possess a highly nonlinear frequency-voltage characteristic. On the other hand, the UHF band covers a much larger number of channels and corresponding larger frequency range. Over this band it is therefore desirable to utilize a tuner possessing a less pronounced voltage versus frequency gradient and, if possible, a linear operating characteristic for the uniform tuning of UHF channels. This situation makes the utilization of hyper abrupt junction varactors in UHF tuners particularly attractive since these varactors possess greater frequency coverage over a given voltage range due to increased dopant gradients in the vicinity of the junction. Thus, a larger number of channels may be accommodated over the same voltage range by a hyper abrupt junction varactor tuner.

The tuning performance of a hyper abrupt junction varactor tuner is shown by curve 3 in FIG. 1 where channel number, or tuning frequency, is shown as a function of tuning voltage. From this it can be seen that a near linear, uniform channel spacing is available with this type tuner over the UHF tuning band. However, also shown on each side of curve 3 is the variation in tuner performance for a typical production lot of hyper abrupt varactor diode tuners. It can be seen that there is considerable overlap in tuning voltage between adjacent UHF channels. This undesirable situation is compounded in a typical tuner system where several varactors must be carefully matched in performance to insure proper tuning over both UHF and VHF bands. Abrupt junction varactor diode tuners are of limited use over the large UHF tuning band because of their limited frequency tuning capability over a given input voltage range.

Figure 2:
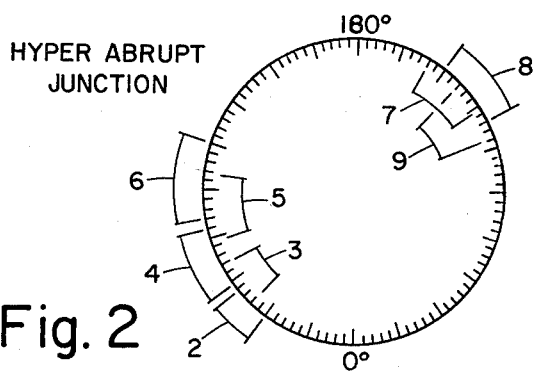
FIG. 2 illustrates the relationship between angular displacement of a rotatable channel selector and channel number location on a circular dial in which the selector operates a tuning stage utilizing hyper abrupt junction varactor diodes.
Figure 3:
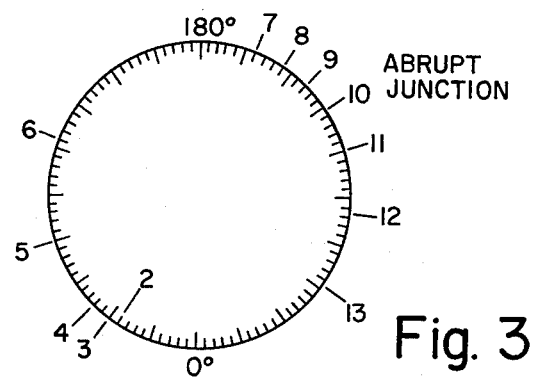
FIG. 3 illustrates the relationship between angular displacement of a rotatable selector and channel number location on a circular dial in which the selector controls a tuning stage utilizing abrupt junction varactor diodes.

FIG. 2 shows the location on a circular dial scale of VHF channels for a hyper abrupt varactor diode tuner. From this is can be seen that nonuniform channel spacing and extensive channel overlap in the VHF band are operating characteristics of this type of tuner. Accurate tuning is thus made impossible by interchannel interference of hyper abrupt junction varactor tuners in the VHF band. Shown in FIG. 3 is channel number displacement on a circular dial scale over the VHF spectrum for an abrupt junction varactor diode tuner. From this it can be seen that while the abrupt junction varactor does not suffer from inter-channel interference due to extensive channel overlap, it does exhibit a nonlinear channel tuning characteristic which has low VHF channels closely grouped in one portion of the dial scale with relatively large inter-channel dial spacing between channels in the mid-VHF band.

Figure 4:
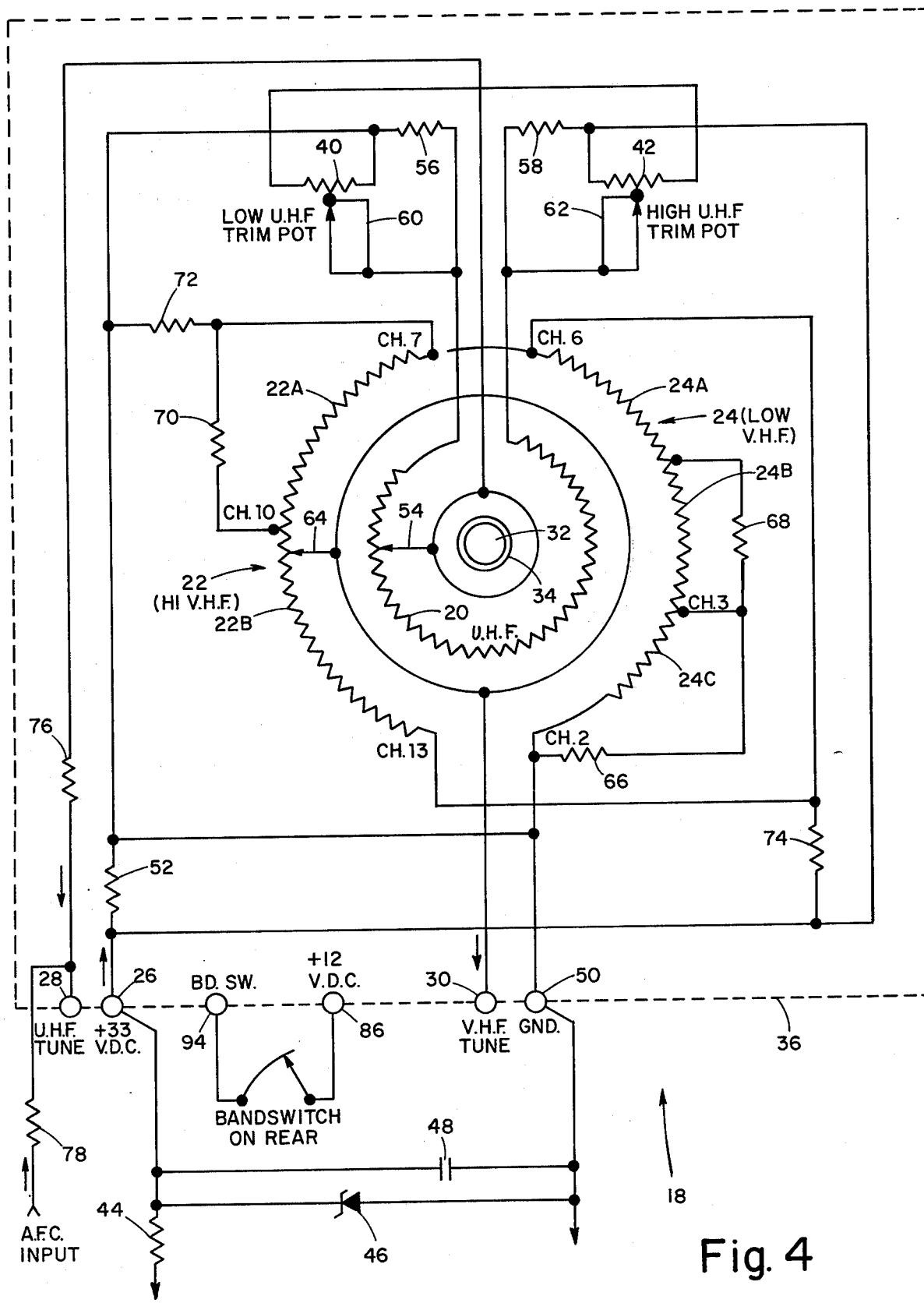
FIG. 4 is a schematic diagram of a continuous tune, all-channel selector in accordance with a preferred embodiment of the present invention.

FIG. 4 is a schematic diagram of a preferred embodiment of the continuous tune, all-channel selector 18. In accordance with the present invention, three variable resistors 20, 22 and 24 are used to vary the voltage applied to varactor tuners (not shown) in a continuous manner in providing a continuous channel tune capability. A +33 volt DC input to the continuous tune omni-channel selector 18 is provided by a voltage source (not shown) in combination with a reference diode 46 by means of input pin 26. Channel selector 18 then selectively varies the output voltage provided to the tuning stages via UHF output pin 28 and VHF output pin 30. A rotatable control shaft 32 is positioned in center aperture 34 which is located in substrate 36 upon which channel selector circuitry is deposited. By rotating selector control shaft 32 and thereby moving wiper assembly 38 having respective electrical contacts for each of resistors 20, 22 and 24, the output voltage to tuning stages may be accurately varied in selecting the desired television channel. In addition, variable resistors 40 and 42 permit the lower and upper resistive values, respectively, of variable resistor 20 to be adjusted as desired. This allows for establishing arbitrary tuning voltage values for channels at the lower and upper extremes of the UHF tuning band. In this manner, performance characteristics of individual hyper abrupt junction varactor diodes used in the UHF tuning stages (not shown) may be normalized to an arbitrary voltage-frequency characteristic to which the omni-channel selector 18 may be set by means of variable resistors 40 and 42. This permits all-channel selector 18 to be used with a great variety of hyper abrupt junction varactor diode tuning stages without regard to particular voltage-frequency performance characteristics which may vary considerably from tuning stage to tuning stage.

A detailed description of the operation of channel selector 18 follows. A +33 volt DC input is provided to channel selector 18 via DC input pin 26. Resistor 44 is in series with the voltage source in the television receiver and acts as a current limiter in providing protection for reference diode 46 against power transients on the power supply line caused by cathode-ray tube arcover. Resistor 44 is not positioned on substrate 36, but rather is located on a terminal board (not shown) by means of which channel selector 18 interfaces with other television receiver systems. Reference diode 46 is similarily positioned on the terminal board and acts to establish a temperature stabilized potential (33 volts DC) across the entire channel selector circuit. Reference diode 46 is a multi-junction device and, as such, may exhibit large gains in the high VHF or UHF bands. Excessively large gains at these high frequencies would result in undesirable circuit oscillations. These high frequency oscillations are prevented by the incorporation of capacitor 48 across reference diode 46 from the 33 volt DC input line to ground terminal 50. Capacitor 48 thus acts as a high frequency bypass for reference diode 46.

Resistor 52 acts as a shunt from the 33 volt DC input line to ground to insure that the entire channel selector resistive network, or load across the reference diode 46, is the same without regard to the 30% tolerance in channel selector resistive component performance parameters. By accurately setting the value of resistor 52 overall component tolerances of channel selector 18 may be reduced from 30% to 2-5% for a given production run. In the preferred embodiment of the present invention, which is in substrate circuit form, laser trimming of resistor 52 permits accurate adjustment of the potential developed across channel selector 18. Similarly, the values of other resistors in the substrate circuitry of channel selector 18, with the exception of adjustable resistors, or potentiometers, may be accurately established by laser trimming in combination with a number of test points located throughout the network at which mode voltages may be measured in accurately setting individual resistor values. This technique as applied to substrate circuirtry is well known in the art and does not form a part of the present invention.

Figure 7:
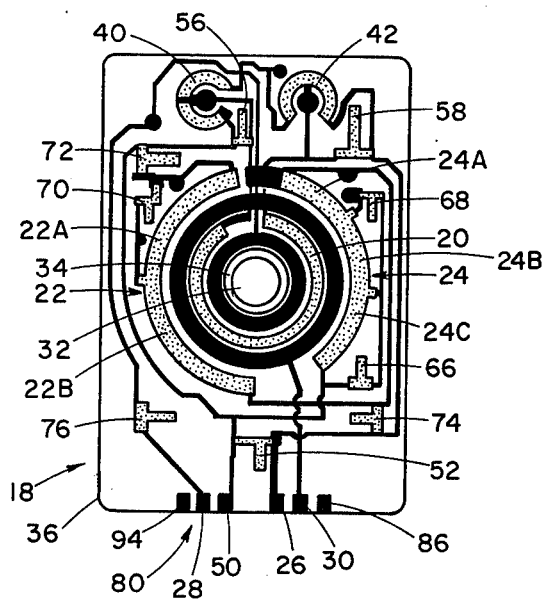
FIG. 7 is a plane view of a substrate circuit in accordance with a preferred embodiment of the present invention as shown in the schematic diagram of FIG. 4.
Figure 5:
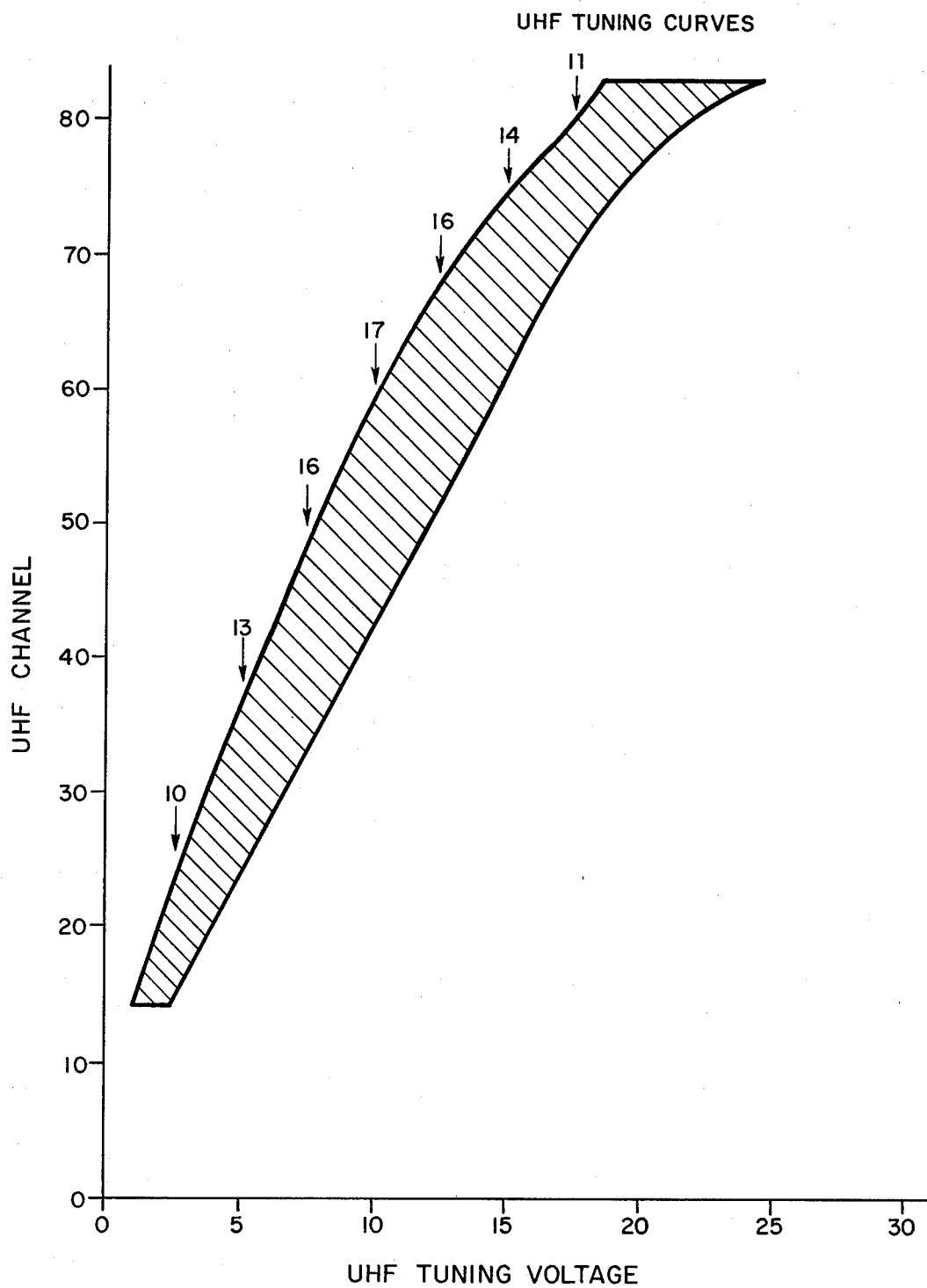
FIG. 5 shows the spread in UHF tuning performance of a random sample of typical hyper abrupt junction varactor diode tuners in which UHF channel tuning is shown as a function of tuning voltage.
Figure 6:
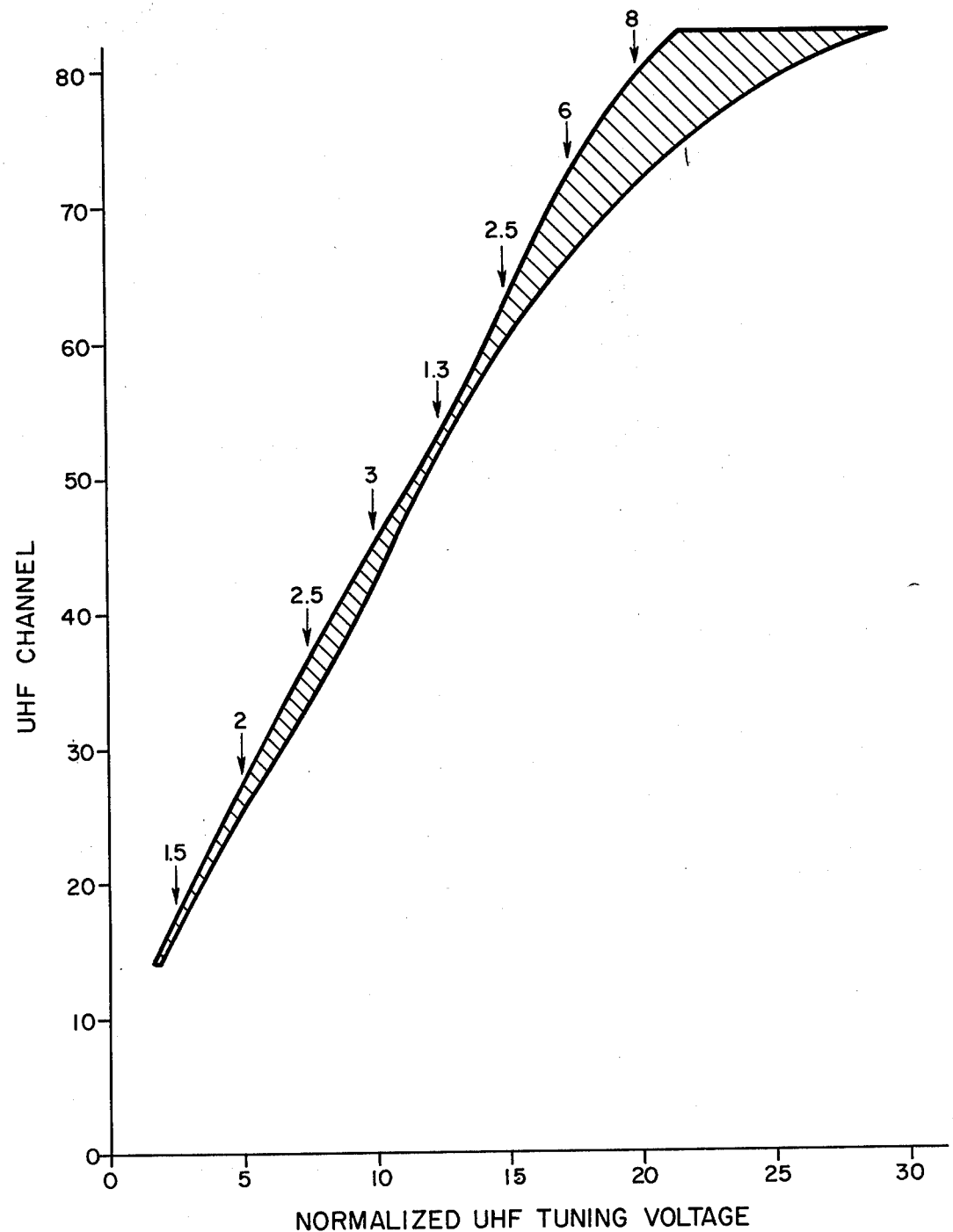
FIG. 6 illustrates UHF tuning performance for a typical production run of hyper abrupt junction varactor diode tuners with UHF channel numbers shown as a function of tuning voltage in which tuning performance has been normalized by setting upper and lower UHF channel number limits at arbitrary tuning voltages.

The DC input in then provided to UHF variable resistor 20, high VHF variable resistor 22 and low VHF variable resistor 24. In the preferred embodiment of the present invention resistor 20 is in the form of a circular potentiometer and resistors 22 and 24 are semi-circular potentiometers which, in combination, form a circular variable resistor configuration as shown in FIG. 7. The value of resistor 20 is continuously variable by means of UHF wiper assembly 54 which is cooperatively coupled to rotatable control shaft 32. In addition to the value of resistor 20 being continuously variable and thus providing a continuously variable voltage output to UHF tuning stages via UHF output pin 28, the high and low end resistive values of resistor 20 may be accurately adjusted by means of potentiometers 42 and 40, respectively. Potentiometer 40, which forms a nearly complete circular resistive layer on substrate 36, is coupled to the low voltage end of resistor 20 and allows for the variation of low end output voltage to UHF tuner stages. Similarly, potentiometer 42, having a configuration identical to that of potentiometer 40, is coupled to the high voltage end of resistor 20 and permits the high end of the voltage output to UHF tunable stages to be varied over the voltage range defined by the resistive range of potentiometer 42. By thus establishing the high and low tuning voltages provided by channel selector 18 to UHF tuning stages the tuning voltage output may be normalized in order to compensate for the wide variation in production tolerances exhibited by the hyper abrupt junction varactor diodes employed in the UHF tuning stages. The wide variation in hyper abrupt junction varactor diode tuning stage performance characteristics is displayed in another form in FIG. 5 where the variation in tuning voltage over the range of UHF channels is shown for a random production run sample of a hyper abrupt junction varactor tuning stage currently in common use. From this set of curves it can be seen that near the center of the UHF band the tuning voltage for a given channel may vary over a range of ±2.5 volts. This results in inadequate channel separation and poor tuning performance. The present invention, by normalizing the upper and lower ends of the UHF tuning curve to predetermined voltage values minimizes the effects of hyper abrupt junction performance variations allowing channel selector 18 to be integrated on a nonselective basis with a wide variety of tuning stages without the necessity of an elaborate alignment or set-up procedure for proper selector-tuner integration. The results of integrating the present invention with a large sample of hyper abrupt junction varactor diode tuning stages are shown in FIG. 6 where UHF tuning voltage has been adjusted at channels 14 and 55 for each individual UHF tuner. This calibration procedure is easily accomplished during channel selector-tuning stage integration by adjusting potentiometer 40 with channel 14 selected and adjusting potentiometer 42 with channel 55 selected for optimum channel reception. By thus calibrating channel selector 18 at these two tuning end points the tuning voltage spread of all intermediate channels is significantly reduced. As shown in FIGS. 5 and 6 representative tuning voltage range is reduced to approxiately one-fifth the value of the unnormalized channel selector. The end result of this increased channel separation is that hyper abrupt varactor diode tuning stages which offer such an attractively large tuning band can be incorporated over the UHF spectrum while avoiding the variation in performance of these devices which produces excessive adjacent channel overlap and inter-channel interference.

Referring again to FIGS. 4 and 7, which shows the present invention is substrate circuit form, half of potentiometers 40 and 42 are bridged by resistors 56 and 58, respectively. These trimmable resistors 56 and 58 establish the voltage levels at either end of UHF potentiometer 20 following the manufacture of the substrate circuit. The halves of potentiometers 40 and 42 not bridged respectively by resistors 56 and 58 are coupled together such that one half of each of these trimmed potentiometers provides an adjustment range to higher than nominal voltages at the high end of the UHF band and to lower than nominal voltages at the low end of the UHF band, respectively. Resistors 56 and 58 are selective so as to compensate for production tolerances in variable adjustable potentiometers 20, 40 and 42 where typically a 30% tolerance factor exists in the as-fired values of these substrate potentiometers. Thus, while variable potentiometers 40 and 42 in combination with potentiometer 20 compensate for inherent hyper abrupt junction varactor diode tuner variations, resistors 56 and 58 provide compensation for production tolerances in adjustable potentiometers 40, 42 and 20. In addition, resistors 56 and 58 are selected so as to minimize, in combination with conductors 60 and 62, current through the contact points and wiper arms of potentiometers 40 and 42, respectively. With most of the current transmitted through conductors 60 and 62, the contact voltage variation in potentiometers 40 and 42 is minimized thus stabilizing the lower and upper voltage limits of the UHF tuning voltage range.

Semi-circular potentiometers 22 and 24 provide a continuously variable tuning voltage to VHF tuning stages in which abrupt junction varactor diodes are utilized. Potentiometer 24 is used for tuning in the lower VHF band (channels 2-6), while potentiometer 22 is used for high VHF tuning (channels 7-13). Voltage divider networks coupled to each of these potentiometers provide for a substantially linear relationship between channel number position and angular displacement on the potentiometer combination. High VHF potentiometer 22 is further divided into two voltage compensating segments 22A and 22B with segment 22A providing for tuning from channel 7 to channel 10 and segment 22B providing for tuning from channel 10 through channel 13. Similarly, low VHF potentiometer 24 is divided into three voltage compensating segments 24A, 24B and 24C. Resistive segment 24C covers channel 2 and channel 3, resistive segment 24B covers channel 3 and channel 4, and resistive segment 24A covers channels 5 and 6. As wiper arm 64 is moved around VHF potentiometers 22 and 24 the output voltage to VHF tuning stages is varied thus providing for continuous, non-detent VHF channel selection.

The voltage divider network for low VHF potentiometer 24 is comprised of resistors 66 and 68. Resistor 66 establishes the voltage drop across low VHF potentiometer segment 24C while resistor 68 establishes the potential drop across segment 24B of low VHF potentiometer 24. The values of resistors 66 and 68 are selected to provide a predetermined angular displacement between adjacent channels resulting in a substantially linear relationship between angular displacement and channel number coverage. Because of the large variation in the tuning voltage versus frequency gradient of the abrupt junction varactor diodes in the VHF tuning stages, the voltage drop across compensating segment 24A is much greater than that across 24B which, in turn, is substantially larger than that across resistive segment 24C. Because the voltage range from channel 2 to channel 3 is smaller than that from channel 3 to channel 4 which, in turn, is smaller than the voltage range from channel 5 to channel 6, resistors 66 and 68 are incorporated in the voltage divider network to compensate for inter-channel voltage variations thus providing near uniform inter-channel angular displacement.

The voltage divider network across low VHF potentiometer 24 thus produces a tapered effect in low VHF band tuning which compensates for the nonlinearities of abrupt junction varactor diode tuner voltage-to-frequency characteristics. High VHF potentiometer 22, because it is segmented into two voltage compensating components 22A and 22B, is bridged by a single voltage divider network comprised of resistor 70. Resistor 70 is shunted across high VHF potentiometer 22 so as to provide a reduced tuning voltage range in tuning from channel 7 to channel 10 with a larger voltage variation between channels 10 and 13. Again, this tuning voltage differential variation is a function of abrupt junction varactor diode characteristics as implemented in the VHF tuning stages. A tapered effect is thus imposed on high VHF potentiometer 22 to provide for uniform inter-channel spacing from channel 7 to channel 13. Because the voltage change from channel 7 to channel 13 is not as severe as the change from channel 2 to channel 6, only one voltage tap is necessary on high VHF potentiometer 22. One less trimmable resistor than the number of compensating segments required is necessary because the unparalled, or unshunted, section is used as a reference voltage range to which all other resistor segments are adjusted by the laser trimming of shunted resistors. Resistor 72 establishes the voltage ratio at the channel 7 end of high VHF potentiometer 22 relative to the voltage at the 33 volt DC reference diode 46. It thus establishes the base line reference voltage for the entire high VHF tuning band. Resistor 74 establishes the voltage levels at channel 6 on low VHF potentiometer 24 and channel 13 on high VHF potentiometer 22. The value of resistor 74 is selected such that both channel 6 and channel 13 are tuned in at a tuning voltage of 23.5 volts. To insure that this tuning voltage is available for tuning in channels 6 and 13, the top ends of potentiometers 22 and 24 are trimmed to 28.6 volts with a nominal 33 volt input provided to channel selector 18. At the other end, low VHF potentiometer 24 is adjusted to one volt at channel 2 while the low end of high VHF potentiometer 22 is adjusted to 6 volts in tuning in channel 7.

An automatic frequency control (AFC) mode is utilized in combination with the UHF tuner. Because the effective source impedance of UHF potentiometer 20 changes from one end to the other, the AFC figure of merit varies over the UHF band. Resistor 76 sets a minimum AFC figure of merit over the UHF tuning band in combination with resistor 78 located on the terminal board (not shown). This is accomplished by resistor 76 establishing a minimum source impedance for UHF potentiometer 20, thus providing a certain minimum AFC figure of merit.

Figure 8:
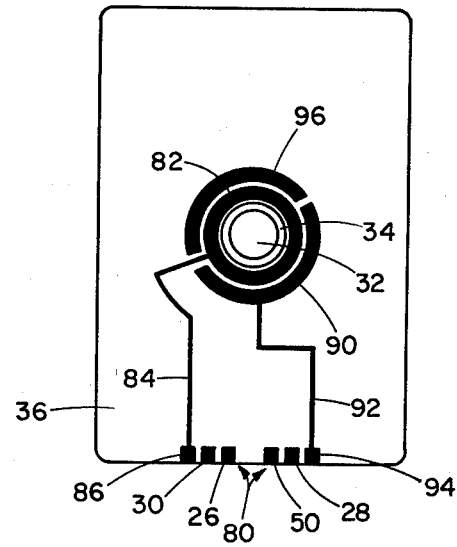
FIG. 8 is a view of the obverse side of the substrate circuit of FIG. 7 showing VHF bandswitching circuitry in accordance with a preferred embodiment of the present invention.
Figures 9, 10, 11, 12:
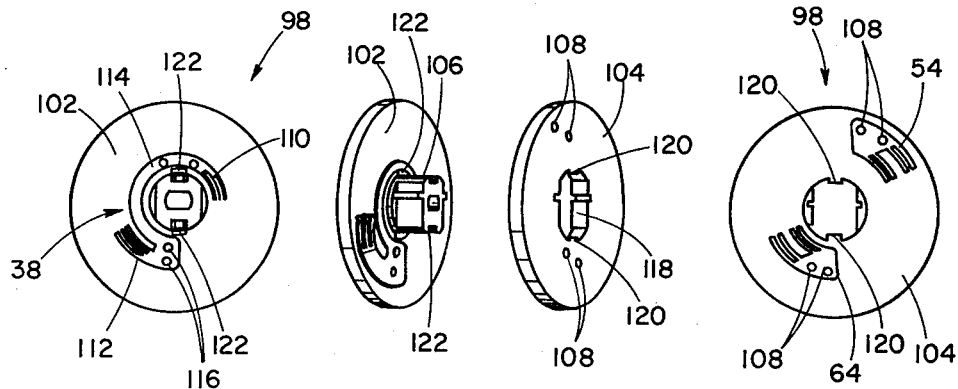
FIGS. 9 through 12 show various views of the channel selector and bandswitching wipers utilized with the substrate circuitry of FIGS. 7 and 8 in accordance with a preferred embodiment of the continuous tune, all-channel selector of the present invention.

FIG. 8 shows the reverse side of substrate 36. A plurality of terminals 80 are located along the edge of the substrate in registration with their counterpart terminals of FIG. 7. A B+ contact ring 82 is disposed radially outwardly from circular aperture 34 and is connected via a conductive connector 84 to B+ terminal 86 at the edge of substrate 36. A C-shaped high VHF band end in band switch contact ring segment 90 is radially outwardly disposed from contact ring 82. High VHF band switch ring 90 is connected via conductive connector 92 to band switch terminal 94 located on substrate 36. A C-shaped low VHF band contact ring 96 is similarly radially outwardly disposed of B+ contact ring 82 and is isolated from high VHF band switch ring 90. In addition, low VHF band switch ring 96 is not connected externally and performs no electrical function, but provides a track for VHF band switch wiper contact 64. The band switch B+ output thus controls the VHF tuner by means of a step voltage function, i.e., the B+ voltage applied to channel selector 18 is either off (low VHF) or on (high VHF) at +12 volts DC. VHF/UHF band switching may be accomplished by means of a toggle switch and any of the more conventional band switching techniques and does not form a part of the present invention.

Substrate 36 as shown in FIGS. 7 and 8 is preferably made of a stable ceramic material such as alumina and has a central aperture 34 and a plurality of printed resistive and conductive elements. A plurality of terminals 80 are formed by metalized areas along one edge of the substrate to facilitate connection of the channel selector 18 to external circuitry. The substrate may be mounted in any convenient manner with the regularly arranged terminals 80 cooperating with a corresponding socket member (not shown). The back side of substrate 36 provides B+ band switching voltage to VHF tuners while UHF band switching potential is provided to UHF tuners by means of a toggle switch (not shown) in combination with currently available switching circuitry.

All of the resistors forming the voltage divider network of VHF potentiometers 22 and 24 are on substrate 36. The resistors and various potentiometer resistance elements are preferably formed of deposited resistive material overlying (or underlying as the case may be) appropriately patterned conductive elements on substrate 36. The technique for making substrate 36 with its deposited conductive and resistive elements is well known and will not be detailed in this disclosure.

FIGS. 9, 10, 11 and 12 show various views of channel select-band switch wiper assembly 98. Primary components of channel select-band switch wiper assembly 98 are first and second rotatably movable end plates 102 and 104, channel select wiper assemblies 54 and 64, band switch wiper assembly 38 and operating shaft 106. UHF and VHF wiper assemblies 54 and 64 are angularly spaced members formed of resilient metal having a plurality of contact members either formed by deformation of the angular members or by the attachment of contact material thereto. Because of the wipers' resiliency, the contacts are urged in good mechanical and electrical connection with their respective contact rings. Each channel switch wiper is mounted to the second rotatably movable end plate 104 by means of a pair of mounting tabs and associated apertures 108.

Bandswitch wiper assembly 38 is comprised of B+ wiper assembly 110 and hi-VHF bandswitch wiper assembly 112 which are coupled by means of metal connecting strip 114 to ensure the maintenance of relative position between wiper assemblies. Wiper assemblies 110 and 112 possess the same resilient characteristics as wiper assemblies 64 and 54 as described earlier and similarly include multiple contacts either formed by deformation of the annular members or by attachment of contact material thereto. B+ wiper assembly 110 is maintained in continuous contact with B+ contact ring 82 while VHF Hi/Low bandswitching is provided by VHF wiper assembly 64 being in contact with either high VHF bandswitch conducting ring 90 or low VHF bandswitch contact ring 96, respectively. Bandswitch wiper assembly 38 is connected to first rotatably movable end plate 102 by means of a pair of bandswitch select wiper mounting tabs and apertures 116. First rotatably movable end plate is centrally attached to operating shaft 106 which projects through second rotatably movable end plate aperture 118 when channel select-bandswitch wiper assembly 98 is assembled. Positioned on each side of operating shaft 106 and displaced 180° from each other on first rotatably movable end plate 102 are lock tab apertures 120 through which lock tabs 122 located on the second end plate 104 are inserted. This locking mechanism provides for a rigid assembly of first and second rotatably movable end plates in forming the channel select-bandswitch wiper assembly 98. Both end plates 102 and 104 are preferably fabricated of a non-conductive material such as plastic. The particular size and shape of end plates 102 and 104 as well as the constructional details of operating shaft 106 is a matter of choice and may take any of a number of well-known forms and the illustrated configuration is merely one of many suitable for the purpose.

While the present invention has been described in combination with an abrupt-hyper abrupt junction varactor diode tuner combination, it will be apparent to those skilled in the art that it could be equally as well implemented with an all hyper abrupt junction varactor diode UHF-VHF all-channel tuning system. The dual potentiometer normalization approach employed over the UHF band in combination with hyper abrupt junction varactor tuning stages as described in this specification could be extended for use over the VHF band and used in combination with VHF hyper abrupt junction varactor diode tuning stages. In other words, the invention disclosed herein is not simply limited in its application to abrupt junction varactor diode VHF tuning stages in combination with hyper abrupt junction varactor diode UHF tuning stages.

What has been described is a novel UHF-VHF all-channel selector providing continuous, non-detent channel selection by means of a single control. Substantially uniform inter-channel angular displacement is achieved between all channels in the UHF-VHF bands for UHF hyper abrupt and VHF abrupt junction varactor diode tuning stages by providing appropriate voltages to these tuning stages by means of this novel tuning selector.

While particular embodiments of the present invention have been shown and described, it will be obvious to those skilled in the art that changes and modifications may be made without departing from the true invention and its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined from the following claims when viewed in their proper prospective against the prior art.

I claim:

1. A continuous tune, all-channel television selector system for providing tuning voltage signals to a variable frequency tuner having a plurality of tunable stages, wherein bandswitching is accomplished by selectively coupling a first DC potential source to said tunable stages, each of said VHF tunable stages including an abrupt junction-type varactor diode having a nonlinear frequency-to-tuning voltage characteristic and each of said UHF tunable stages including a hyper abrupt junction-type varactor diode having a frequency-to-tuning voltage characteristic which varies substantially from UHF tunable stage to UHF tunable stage, said channel selector system comprising:

a second DC potential source;

first continuously variable, contact resistor means coupling said second DC potential source to said varactor diodes in said VHF tunable stages, said first variable resistor means having a tapered, nonlinear contact position-to-output voltage characteristic which is complementary to the nonlinear frequency-to-tuning voltage characteristic of said VHF tunable stages, said complementary nonlinear characteristic producing a substantially linear first variable resistance means contact position-to-frequency characteristic;

second continuously variable, contact resistor means coupling said second DC potential source to said varactor diodes in said UHF tunable stages, said second variable resistor means having a substantially linear contact position-to-output voltage characteristic;

third and fourth continuously variable, contact resistor means coupled to the low resistance and high resistance ends, respectively, of said second contact resistor means for adjusting the low and high resistance values, respectively, of said second contact resistor means in normalizing said second contact resistor means to a predetermined UHF tunable stage frequency-to-tuning voltage characteristic variation; and rotatable selector shaft means operatively coupled to said first and second continuously variable, contact resistor means for changing the voltage applied to said varactor diodes by means of said first and second resistor means in tuning said tunable stages over the entire VHF and UHF television spectra, respectively.

2. A selector system according to claim 1 wherein said first and second continuously variable, contact resistor means are potentiometers including a plurality of wiper arms for coupling said second DC potential source to said varactor diodes in said tunable stages.

3. A selector system according to claim 1 further comprising VHF bandswitching means operatively coupled to said rotatable selector shaft means and to said first continuously variable, contact resistor means for coupling said first DC potential source to said VHF tunable stages for selecting high VHF band channels.

4. A selector system according to claim 1 wherein said first continuously variable, contact resistor means is coupled to a plurality of voltage divider networks, said voltage divider networks providing said first contact resistor means with a nonlinearity-compensating, tapered contact position-to-output voltage characteristic resulting in a substantially linear contact position-to-frequency characteristic of said selector and tuner combination.

5. A selector system according to claim 1 wherein said third and fourth continuously variable, contact resistor means are respectively adjusted to provide an optimally selected low UHF channel and an optimally selected high UHF channel in normalizing said second contact resistor means to a predetermined UHF tunable stage frequency-to-tuning voltage characteristic variation.

6. A continuous tune, all-channel television selector system for providing tuning voltage signals to a variable frequency tuner having a plurality of tunable stages, wherein UHF band switching is accomplished by selectively coupling a first DC potential source to UHF tunable stages, each of said UHF tunable stages including a hyper abrupt junction-type varactor diode having a frequency-to-tuning voltage characteristic which varies substantially from UHF tunable stage to UHF tunable stage, and including VHF tunable stages having an abrupt junction-type varactor diode with a nonlinear frequency-to-tuning voltage characteristic, said channel selector system comprising:

a second DC potential source;

first continuously variable, contact resistor means coupling said second DC potential source to said varactor diodes in said VHF tunable stages, said first variable resistor means having a tapered, nonlinear contact position-to-output voltage characteristic which is complementary to the nonlinear frequency-to-tuning voltage characteristic of said VHF tunable stages, said complementary nonlinear characteristic producing a substantially linear first variable resistance means contact position-to-frequency characteristic;

second continuously variable, contact resistor means coupling said second DC potential source to said varactor diodes in said UHF tunable stages, said second variable resistor means having a substantially linear contact position-to-output voltage characteristic;

third and fourth continuously variable, contact resistor means coupled to the low resistance and high resistance ends, respectively, of said second contact resistor means for adjusting the low and high resistance values, respectively, of said second contact resistor means by optimally selecting a low UHF channel and a high UHF channel in normalizing said second contact resistor means to a predetermined UHF tunable stage frequency-to-tuning voltage characteristic variation;

bandswitching means coupled to said first continuously variable, contact resistor means for coupling said second DC potential source to said VHF tunable stages for selecting high VHF band channels; and rotatable selector shaft means operatively coupled to said first and second continously variable, contact resistor means and to said band switching means for changing the voltage applied to said varactor diodes by means of said first and second resistor means in tuning said tunable stages over the entire VHF and UHF television spectra, respectively.

7. A continuous tune, all-channel television selector system for providing tuning voltage signals to a variable frequency tuner having a plurality of VHF and UHF tunable stages, each of said VHF tunable stages including an abrupt junction-type varactor diode having a nonlinear frequency-to-tuning voltage characteristic and each of said UHF tunable stages including a hyper abrupt junction-type varactor diode having a frequency-to-tuning voltage characteristic which varies substantially from UHF tunable stage to UHF tunable stage, said channel selector system comprising:

a first DC potential source;

first continuously variable, circular contact resistor means coupling said first DC potential source to said varactor diodes in said VHF tunable stages, said first variable resistor means having a tapered, nonlinear contact position-to-output voltage characteristic which is complementary to the nonlinear frequency-to-tuning voltage characteristic of said VHF tunable stages, said complementary nonlinear characteristic producing a substantially linear first variable resistance means contact position-to-frequency characteristic;

second continuously variable, circular contact resistor means coupling said first DC potential source to said varactor diodes in said UHF tunable stages, said second variable resistor means having a substantially linear contact position-to-output voltage characteristic;

third and fourth continously variable, circular contact resistor means coupled to the low resistance and high resistance ends, respectively, of said second contact resistor means for adjusting the low and high resistance values, respectively, of said second contact resistor means in normalizing said second contact resistor means to a predetermined UHF tunable stage frequency-to-tuning voltage characteristic variation;

a second DC potential source;

bandswitching means coupled to said first continuously variable, circular contact resistor means for coupling said second DC potential source to said VHF tunable stages for selecting high VHF band channels; and rotatable selector shaft means operatively coupled to said first and second continuously variable, circular contact resistor means and to said bandswitching means for changing the voltage applied to said varactor diodes by means of said first and second resistor means in tuning said tunable stages over the entire VHF and UHF television spectra, respectively.

8. A selector system according to claim 7 wherein said first continuously variable, circular resistor means comprises first and second coupled semicircular resistive sections for tuning to low VHF channels two through six and high VHF channels 7 through 13, respectively.

9. A selector system according to claim 8 wherein said first continuously variable, circular contact resistor means is coupled to a plurality of voltage divider networks, said voltage divider networks providing said first contact resistor means with a nonlinearity-compensating, tapered contact position-to-output voltage characteristic resulting in a substantially linear contact position-to-frequency characteristic of said selector and tuner combination.

10. A selector system according to claim 9 wherein four voltage divider networks are coupled to said first continuously variable, circular contact resistor means in forming a three-segment, contact position-to-output voltage compensating network over said first resistive section for tuning to low VHF channels 2-6 and a two-segment, contact position-to-output voltage compensating network over said second resistive section for tuning to high VHF channels 7-13.

11. A selector system according to claim 7 wherein said third and fourth continously variable, circular contact resistor means are adjusted to provide an optimally selected low UHF channel and an optimally selected high UHF channel in normalizing said second contact resistor means to a predetermined UHF tunable stage frequency-to-tuning voltage characteristic variation.

12. A selector system according to claim 11 wherein said optimally selected low UHF channel is channel 14 and said optimally selected high UHF channel is channel 55.

13. A selector system according to claim 7 wherein said third and fourth continuously variable, circular contact resistor means are potentiometers including a variable position wiper arm for adjusting the low and high resistance values, respectively, of said second contact resistor means.

14. A selector system according to claim 10 wherein said plurality of continuously variable, circular contact resistor means, said voltage divider networks, said band switching means and connecting circuitry associated therewith comprises:
an electrically insulating substrate material;
a plurality of electrically conductive, disconnected elements disposed on said substrate; and
a plurality of resistive layers disposed on said substrate in a disconnected array interconnecting selected portions of said electrically conductive elements in forming said circular contact resistor means, said voltage divider networks, said band switching means and connecting circuitry associated therewith.

15. A selector system according to claim 14 wherein said circular contact resistor means and said voltage divider networks and associated connecting circuitry are located on a first surface of said substrate material with said bandswitching means located on a second surface of said substrate material, said bandswitching means coupled to said circular contact resistor means and voltage divider networks by means of terminal connections on the edge of said substrate material.

16. A selector system according to claim 7 wherein said first and second continuously variable, circular contact resistor means are adjustable potentiometers including a plurality of wiper arms for coupling said first DC potential source to said varactor diodes in said tunable stages.

17. A continuous tune, all-channel television selector system for providing tuning voltage signals to a variable frequency tuner having a plurality of VHF and UHF tunable stages, each of said VHF tunable stages including an abrupt junction-type varactor diode having a nonlinear frequency-to-tuning voltage characteristic and each of said UHF tunable stages including a hyper abrupt junction-type varactor diode having a frequency-to-tuning voltage characteristic which varies substantially from UHF tunable stage to UHF tunable stage, said channel selector system comprising:
a first DC potential source;
first continuously variable, circular contact resistor means coupling said first DC potential source to said varactor diodes in said VHF tunable stages, said first continuously variable, circular contact resistor means being coupled to a plurality of voltage divider networks, said voltage divider networks providing said first contact resistor means with a nonlinearity-compensating, tapered contact position-to-output voltage characteristic resulting in a substantially linear contact position-to-frequency characteristic of said selector and tuner combination;
second continously variable, circular contact resistor means coupling said first DC potential source to said varactor diodes in said UHF tunable stages, said second variable resistor means having a substantially linear contact position-to-output voltage characteristic;
third and fourth continuously variable, circular contact resistor means coupled to the low resistance and high resistance ends, respectively, of said second continuously variable, circular contact resistor means for adjusting the low and high resistance values, respectively, of said second contact resistor means to provide an optimally selected low UHF channel and an optimally selected high UHF channel in normalizing said second contact resistor means to a predetermined UHF tunable stage frequency-to-tuning voltage characteristic variation;
a second DC potential source;
bandswitching means coupled to said first continuously variable, circular contact resistor means for coupling said second DC potential source to said VHF tunable stages for selecting high VHF band channels; and
rotatable selector shaft means operatively coupled to said first and second continously variable, circular contact resistor means and to said bandswitching means for changing the voltage applied to said varactor diodes by means of said first and second resistor means in tuning said tunable stages over the entire VHF and UHF television spectra, respectively.

* * * * *